United States Patent
Aoki

[11] Patent Number: 6,160,308
[45] Date of Patent: Dec. 12, 2000

[54] SEMICONDUCTOR DEVICE

[75] Inventor: Hideo Aoki, Yokohama, Japan

[73] Assignee: Kabushiki Kaisha Toshiba, Kawasaki, Japan

[21] Appl. No.: 09/522,173

[22] Filed: Mar. 9, 2000

[30]     Foreign Application Priority Data

Mar. 10, 1999   [JP]   Japan .................................. 11-063365

[51] Int. Cl.[7] .................................................. H01L 23/02
[52] U.S. Cl. ......................... 257/678; 257/778; 257/780; 257/737; 257/738
[58] Field of Search .................................. 257/778, 780, 257/737, 738, 678

[56]              References Cited

U.S. PATENT DOCUMENTS

| | | | |
|---|---|---|---|
| 5,508,561 | 4/1996 | Tago et al. ............................... | 257/737 |
| 5,726,501 | 3/1998 | Matsubara ................................ | 257/778 |
| 5,766,982 | 6/1998 | Akram et al. . | |
| 5,864,178 | 1/1999 | Yamada et al. ......................... | 257/737 |
| 5,897,335 | 4/1999 | Wyland et al. .......................... | 438/108 |
| 5,912,505 | 6/1999 | Itoh et al. ................................ | 257/737 |
| 5,959,363 | 9/1999 | Yamada et al .......................... | 257/787 |
| 5,962,924 | 10/1999 | Wyland et al. .......................... | 257/778 |
| 5,998,861 | 12/1999 | Hiruta ...................................... | 257/700 |
| 6,011,312 | 1/2000 | Nakazawa et al. ...................... | 257/778 |
| 6,013,953 | 1/2000 | Nishihara et al. ....................... | 257/778 |
| 6,034,427 | 3/2000 | Lan et al. ................................ | 257/698 |

*Primary Examiner*—David Hardy
*Assistant Examiner*—Lourdes Cruz
*Attorney, Agent, or Firm*—Finnegan, Henderson, Farabow, Garrett & Dunner, L.L.P.

[57]              ABSTRACT

The semiconductor device possesses a structure in which on one surface of a wiring substrate a semiconductor element is mounted with a face down and is electrically connected through bumps made of such as solder or the like. In a gap portion between the wiring substrate and the semiconductor element, a resin encapsulation layer (underfill) of epoxy resin or the like is filled to form, thereby alleviating stress due to difference of thermal expansion coefficients of the wiring substrate and the semiconductor element, and mechanically protecting connection portion. An average gap H between the semiconductor element and the wiring substrate, with an average pitch of bumps P and deviation of the gap D, satisfies the equation $$P/4 - D/2 \leq H \leq P/4 + D/2.$$

The semiconductor device is high in reliability of bonded portions and enables to finish filling procedure of resin material for forming underfill in a short time.

5 Claims, 5 Drawing Sheets

SEMICONDUCTOR DEVICE

BACKGROUND OF THE INVENTION

1. Field of the Invention

The present invention relates to a semiconductor device, in particular to a semiconductor device of which resin encapsulation layer (underfill) between a wiring substrate and a semiconductor element can be implemented with high productivity.

2. Description of Related Art

According to the demand for a smaller and thinner semiconductor device, a semiconductor chip (bare chip) has been connected by use of flip-chip bonding. The flip-chip bonding procedure is implemented in the following way. A semiconductor chip is mounted with a surface on which an electrode pad is formed (an electrode pad formed surface) directed downward, namely with a face down, on a wiring substrate. Protruded ball like electrode (hereinafter referred to as bump) made of such as gold or solder attached to the electrode pad is pressed down onto bonding pad of the wiring substrate, followed by heating to carry out reflow procedure of the solder or the like to connect. In comparison with a wire bonding, the flip-chip bonding is advantageous in a mounting density.

In the semiconductor device thus connected by the flip-chip bonding, due to the difference of thermal expansion coefficients of the semiconductor chip of such as silicon or the like and the wiring substrate (for example, a glass cloth-epoxy resin impregnated substrate), thermal stress is caused. The stress exerts on the bumps that are a means for connecting the semiconductor chip and the wiring substrate. As a result of this, reliability of connection is deteriorated.

Accordingly, after reflow procedure of the solder or the like, the subsequent procedures are carried out in the following way. That is, as shown in FIG. 9, into a gap portion (a space) of the semiconductor chip 11 and the wiring substrate 12, liquid resin material 13 such as epoxy resin mixed with filler is injected to fill due to capillary phenomenon to form a resin encapsulation layer called underfill. By use of the resin encapsulation layer, the thermal stress due to the difference of thermal expansion coefficients of the wiring substrate 12 and the semiconductor chip 11 can be alleviated. In addition to this, the flip-chip bonded portion can be strengthened and mechanically protected. In the figure, reference numeral 11a denotes an electrode pad of the semiconductor chip 11, reference numeral 12a a wiring layer and a bonding pad of the wiring substrate 12, reference numeral 14 a solder bump, respectively. reference numeral 15 denotes a dispenser for dripping and supplying the liquid resin material for underfill.

In the existing semiconductor device, however, the size (dimension) of a gap between the semiconductor chip 11 and the wiring substrate 12, without considering any relation to a disposition (connection) pitch of the bumps 14, is set to satisfy a requirement from bonding procedure or reliability. Here, the size of the gap corresponds to a height of the solder bump 14. As a result of this, it used to take a long time to inject to fill the liquid resin material 13. In particular, in the device in which the size (area) of the semiconductor chip 11 is large and the disposition pitch of the bumps 14 is fine such as 250 μm or less, it used to take a much time to finish the filling procedure.

In order to enhance the speed in discharging to fill the liquid resin material 13, the resin material can be heated to make flow viscosity lower. However, depending on the heating temperatures, after elapse of a definite time period, the resin starts to cure. Due to the start of curing reaction, filling speed of the resin material is remarkably lowered that may result in insufficient completion of the filling.

SUMMARY OF THE INVENTION

The present invention is carried out to solve these problems. The object of the present invention is to provide a semiconductor device in which a flip-chip bonded portion between a semiconductor chip and a wiring substrate is high in reliability and resin material for forming underfill can be filled in a short time.

A semiconductor device of the present invention comprises a wiring substrate, a semiconductor element, bumps, and a resin encapsulation layer. In the wiring substrate, a wiring layer and a connecting terminal are formed at least on one main surface of an insulating substrate. The semiconductor element is mounted with a face down on the main surface of the wiring substrate. The bumps are disposed so as to form a plurality of rows on an electrode terminal formed surface (a metallization surface) of the semiconductor element and to connect the semiconductor element and the wiring substrate. The resin encapsulation layer is filled in a gap portion between the semiconductor element and the wiring substrate. Here, an average of a size of a gap (average gap) between the semiconductor element and the wiring substrate is H, an average of disposition pitch (average pitch) of the bumps is P, and deviation of the size of the gap is D, the average gap H satisfies the following equation (1)

$$P/4 - D/2 \leq H \leq P/4 + D/2 \qquad (1).$$

In the present invention, bumps can be consisted of solders such as Pb-Sn, Sn-Ag, or Sn-Ag-Cu solders. These bumps, on an electrode pad formed surface of a semiconductor element, are disposed so as to form a plurality of rows (two or more rows). In particular, in a semiconductor device in which the bumps are disposed so as to form a disposition area, a time for filling resin material can be effectively shortened.

A disposition pitch of bumps is preferable to be in the range of 60 to 250 μm. When the disposition pitch exceeds 250 μm, the filling time can not be effectively shortened. When the disposition pitch is less than 60 μm, there is a limit from a manufacturing point of view, causing difficulties.

For a wiring substrate, one formed in the following way can be used. At least on one main surface (one surface or both surfaces) of an insulating substrate such as a glass cloth-resin impregnated substrate, a wiring layer and bonding pads consisting of Cu, Cu based alloys or Ni based alloys are disposed to form the wiring substrate 3.

In the present semiconductor device, by setting the average H of the size of the gap (average gap) between the wiring substrate and the semiconductor element in the range shown by the equation (1), resin filling operation for forming the underfill can be finished as soon as possible. Thereby, productivity thereof can be heightened.

DETAILED DESCRIPTION OF THE PREFERRED EMBODIMENTS

In the following, preferable embodiments of the present invention will be described.

A semiconductor device of the present invention comprises a wiring substrate, a semiconductor element, bumps, and a resin encapsulation layer. In the wiring substrate, a wiring layer and a connecting terminal are formed at least on one main surface of an insulating substrate. The semiconductor element is mounted with a face down on the main surface of the wiring substrate. The bumps are disposed so as to form a plurality of rows on an electrode terminal formed surface (a metallization surface) of the semiconductor element and to connect the semiconductor element and the wiring substrate. The resin encapsulation layer is filled in a gap portion between the semiconductor element and the wiring substrate. Here, an average of a size of a gap (average gap) between the semiconductor element and the wiring substrate is H, an average of disposition pitch (average pitch) of the bumps is P, and deviation of the size of the gap is D, the average gap H satisfies the following equation (1)

$$P/4 - D/2 \leq H \leq P/4 + D/2 \qquad (1).$$

Figure 1:
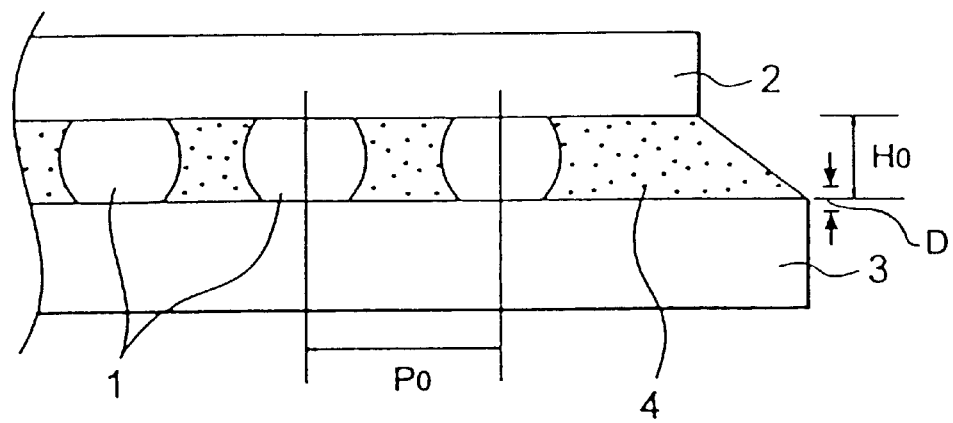
FIG. 1 is a diagram schematically showing a structure of a semiconductor device of the present invention.

A structure of the present semiconductor device is schematically shown in FIG. 1. In the figure, reference numerals 1, 2, 3 and 4 denote bumps, semiconductor element (chip), wiring substrate and resin encapsulation layer (underfill), respectively. The size of the gap $H_0$ between the semiconductor element 2 and the wiring substrate 3, and the disposition pitch $P_0$ of the bumps 4 are shown, respectively.

In the semiconductor device, the bumps 1 can be consisted of solders such as Pb-Sn, Sn-Ag, or Sn-Ag-Cu solders. These bumps 1, on an electrode pad formed surface of the semiconductor element 2, are disposed so as to form a plurality of rows (two or more rows). In particular, in a semiconductor device in which the bumps are disposed so as to form a disposition area, a time for filling the resin material can be effectively shortened. The disposition pitch $P_0$ of bumps 1 is preferable to be in the range of 60 to 250 μm. When the disposition pitch $P_0$ exceeds 250 μm, the filling time can not be effectively shortened. When the disposition pitch is less than 60 μm, there is a limit from a manufacturing point of view, causing difficulties.

For the wiring substrate 3, one formed in the following way can be used. At least on one main surface (one surface or both surfaces) of an insulating substrate such as a glass cloth-resin impregnated substrate, a wiring layer and bonding pads consisting of Cu, Cu based alloys or Ni based alloys are disposed to form the wiring substrate 3.

In the present semiconductor device, by setting the average H of the size of the gap (average gap) between the wiring substrate 3 and the semiconductor element 2 in the range shown by the equation (1), resin filling operation for forming the underfill can be finished as soon as possible. Thereby, productivity thereof can be heightened.

Figure 2:
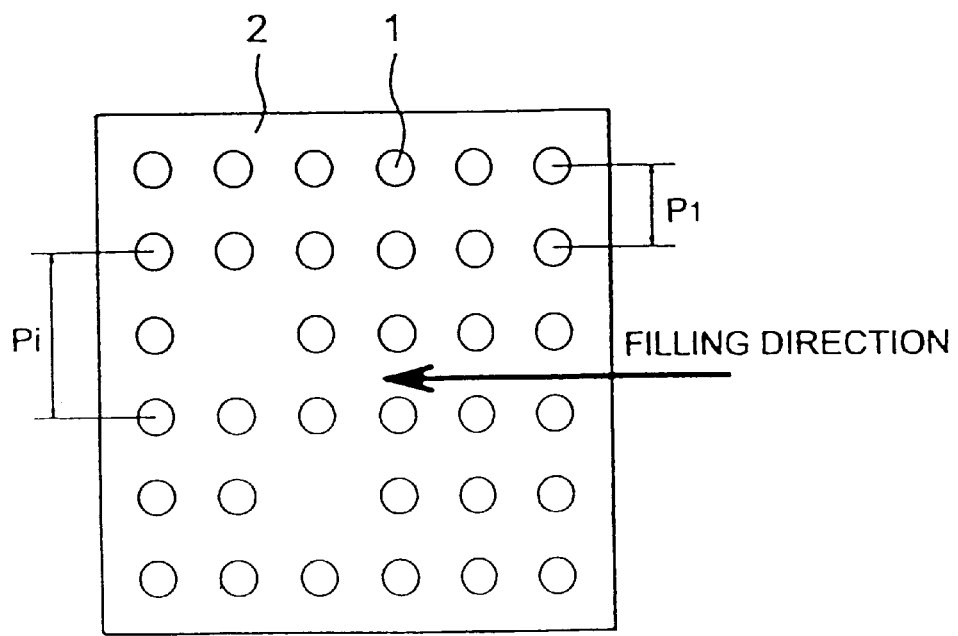
FIG. 2 is a plan view of a semiconductor element showing an average pitch of bumps in the present semiconductor device.

Ordinarily, the disposition pitches of the bumps 1 are not uniform over an entire disposition surface but different depending on position. Accordingly, P denotes an average of disposition pitches (average pitch). The average pitch P, as shown in FIG. 2, can be an average value of separations $P_i$ (i=1, 2, 3 . . . ) between bump rows disposed along a direction of filling the resin material. ($P = \Sigma P_i / N$ (i=1, 2, 3 . . . ), here N is the number of bumps).

The gap (dimension) between the semiconductor element 2 and the wiring substrate 3 has deviation D (=maximum gap value $H_{max}$-minimum gap value $H_{min}$). The deviation D is caused due to deviation coming from manufacture of each component of the semiconductor device, such as warp of the semiconductor element 2 and warp of the wiring substrate 3, deviation of the height of individual bump 1, or the like. Accordingly, considering also these deviations, the equation (1) is determined.

Next, the process through which the equation (1) is reached will be shown in the following.

As mentioned above, the liquid resin material for underfill is injected to fill the gap portion between the semiconductor element and the wiring substrate. Accordingly, a time for filling the resin material depends on the size of the gap, the disposition (connection) pitch of the bumps, the length of the part to be filled, fluidity (viscosity) of the resin material, and surface tension of the resin material.

That is, the filling being done due to the capillary phenomenon, when the size of the gap is made larger (broader) flow resistance becomes smaller to enhance the filling speed, resulting, in shortening the filling time. Similarly, when the diameters of the bumps are the same, the larger disposition pitch of bumps becomes, the lower the fluid resistance, resulting in shortening the time for filling. When the disposition pitches of the bumps are the same, the smaller the diameter of the bump are made, the lower the flow resistance, resulting in increasing the filling speed.

Figure 3:
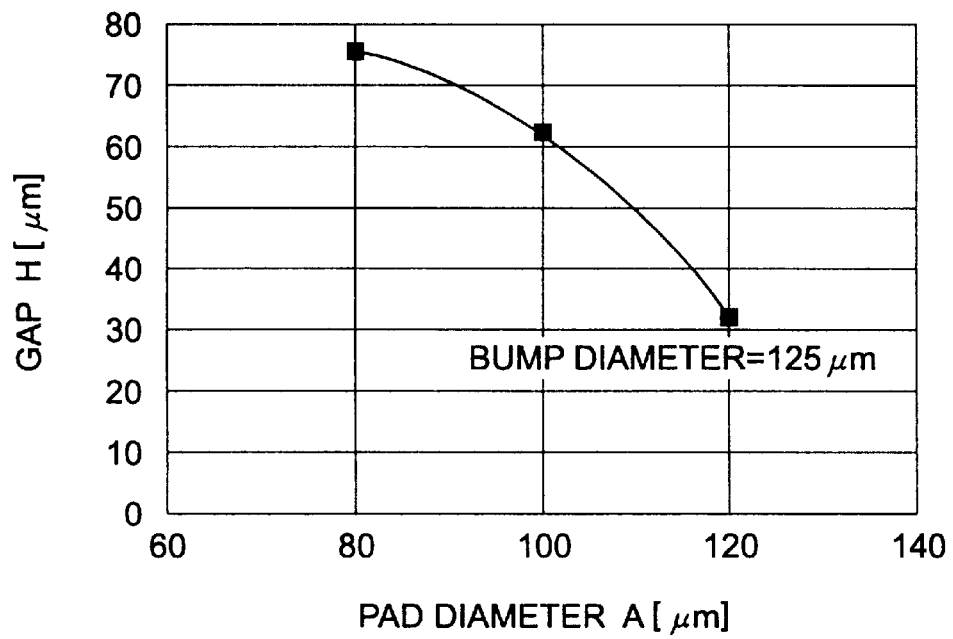
FIG. 3 is a diagram showing the relationship of pad diameter A and magnitude H of a gap between a semiconductor element and a wiring substrate in a flip-chip bonded body.

FIG. 3 is a diagram showing a relationship between diameter A of an electrode pad (bonding pad) of a wiring substrate and the size H of the gap between a semiconductor element and the wiring substrate. This diagram is formed based on actual data of measurements of the magnitude H of the gap obtained when, with the diameter of the bump fixed at a constant value of 125 μm (that is, the volume of the bump is a definite value), the pad diameter A is varied. From this diagram, even at the same bump diameter, the smaller pad diameter permits to make the bump higher, that is, to make the size H of the gap larger.

However, the diameter A of the electrode pad of the semiconductor element and the wiring substrate, due to manufacturing process and reliability, is not preferable to be too small. The defect in reliability is caused by such as tress concentration on the connection, migration due to an increase of current density or the like. At the present time, the practical minimum value of the pad diameter A is approximately 100 μm.

Figure 4:
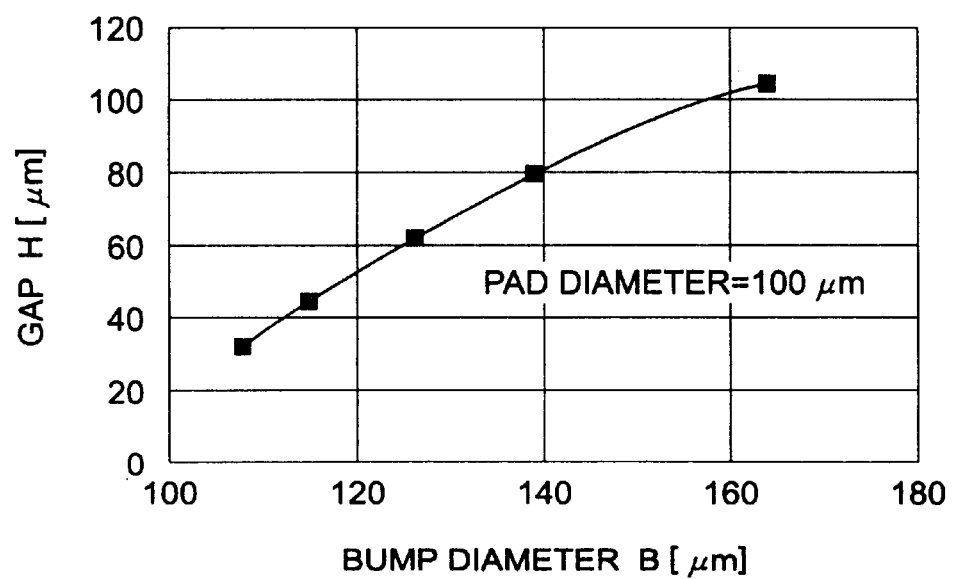
FIG. 4 is a diagram showing the relationship of bump diameter B and magnitude H of a gap in a flip-chip bonded body.

FIG. 4 is a diagram showing results obtained when, with the pad diameter fixed at 100 μm, the bump diameter B and the size H of the gap are actually measured by varying an amount of solder of the bump. From this diagram, to make the magnitude H of the gap larger, the bump diameter is also necessary to be made larger.

Factors, the magnitude H of the gap and the bump diameter B, are in a reciprocal relation from a flow resistance viewpoint. According to the results of melt flow analysis of liquid resin materials, there are optimum values for the magnitude H of the gap and the bump diameter B according to the disposition pitch P of the bumps.

Figure 5:
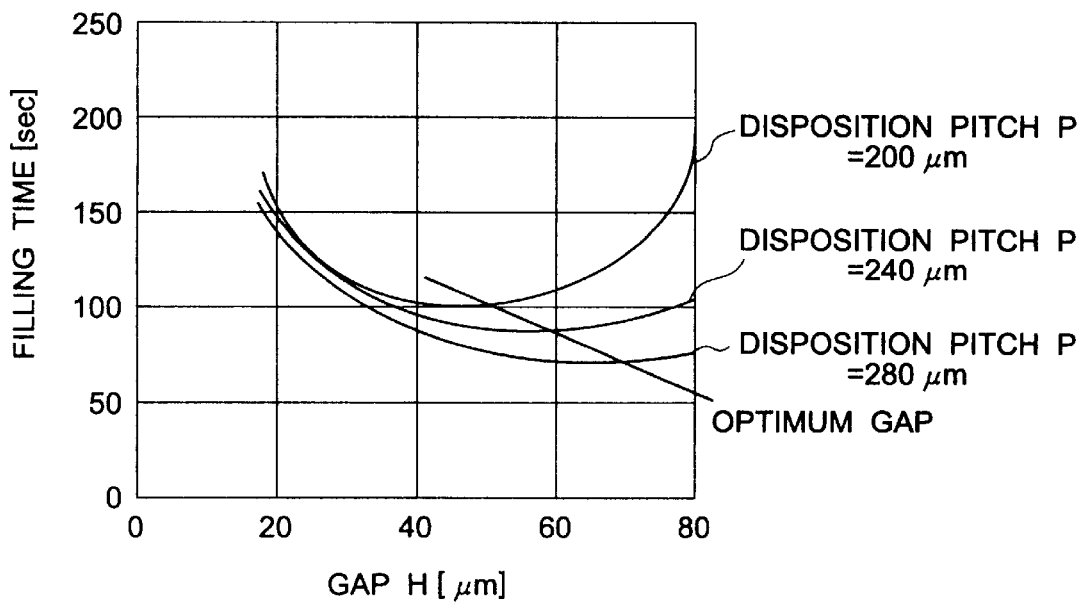
FIG. 5 is a diagram showing the relationship of magnitude H of a gap between a semiconductor element and a wiring substrate, and time for filling resin into a flip-chip bonded body.

FIG. 5 is a diagram showing results of experiments and melt flow analysis in which balance of the capillary force and flow resistance is considered. From this diagram, the following are found. That is, there exists a minimum value of the filling time of the liquid resin material, the optimum gap H at which the filling time becomes the minimum being approximately one fourth (H=P/4) of the disposition pitch P of the bumps. It is confirmed from the results of the analysis and the experiments that this proportional relationship holds for all resin materials despite of various physical properties and filling temperatures thereof.

In the case of the magnitude H of the gap and the disposition pitch P of the bumps being in definite ranges, respectively, even if the magnitude H of the gap is an average value and the disposition pitch P is an average value of separations of bump rows disposed along a filling direction of the resin material, the aforementioned relation holds.

The aforementioned is a consideration for the case where both the semiconductor element and the wiring substrate is assumed to be completely flat. Actually, there exists a little warp for each of the semiconductor element and the wiring substrate. The solder bumps have deviation of height due to manufacturing procedure. In addition, due to manufacturing procedure, the pad diameter, the amount of warp of the semiconductor element and the amount of warp of the wiring substrate deviate. Accordingly, the magnitude of the gap of the semiconductor element and the wiring substrate fluctuates up and down in a certain range. The amount of deviation D that is the range of the up and down fluctuation, though different depending on the individual case, is ordinarily 10 to 20 $\mu$m.

In a semiconductor device in which a semiconductor element is mounted on a wiring substrate by flip-chip bonding, an average H of the magnitude of the gap between the semiconductor element and the wiring substrate, which corresponds to a height of a bump, is set to satisfy the following equation.

$$P/4-D/2 \leq H \leq P/4+D/2$$

Thereby, the resin can be filled into the gap in a short time period to form an excellent underfill. Accordingly, a semiconductor device of high reliability at connection can be fabricated with high productivity and with low cost.

When the temperature is raised, prior to curing of the resin, the viscosity of the resin decreases to enable to shorten the filling time. In the present semiconductor device, since the filling time is very short, before the start of curing, the filling procedure can be finished. Accordingly, the filling can be carried out even at elevated temperatures, resulting in further improvement of productivity.

In particular, when the average pitch P of the bumps is 250 $\mu$m or less, the flow resistance of the bumps remarkably increases to result in a significant increase of the filling time. Accordingly, if the magnitude of the gap is not set at the optimum, the productivity of a semiconductor device is largely affected to result in deterioration. In the present invention, application of the average gap H set in the present invention enables to obtain much industrial value.

Figure 6:
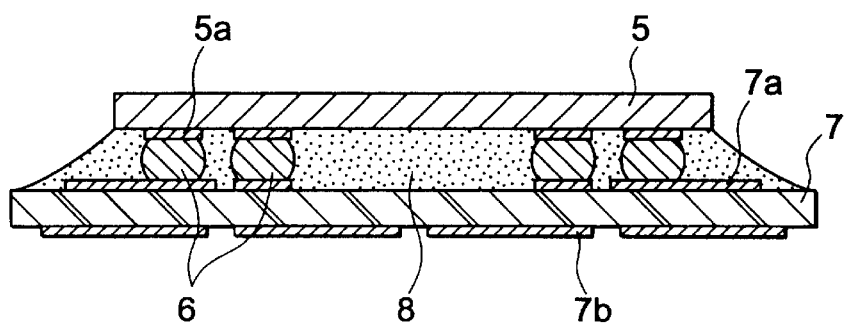
FIG. 6 is a cross section showing a first embodiment of the present semiconductor device.
Figure 7:
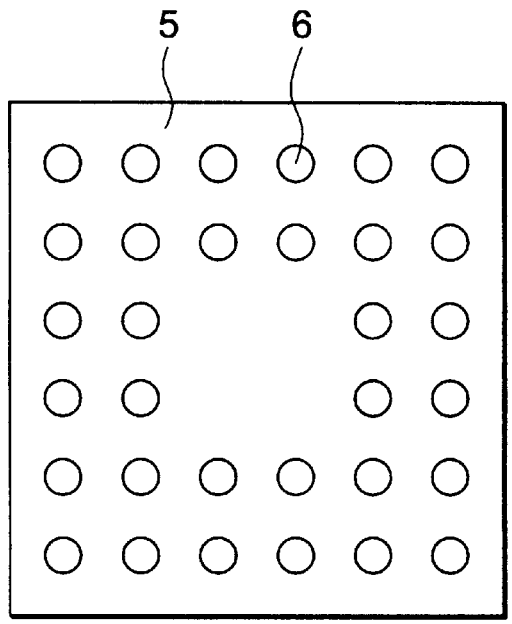
FIG. 7 is a plan view of a semiconductor chip showing a state of disposition of bumps in the first embodiment.

FIG. 6 is a cross section of a first embodiment of a semiconductor device of the present invention, and FIG. 7 is, in the same embodiment, a plan view of a semiconductor chip showing a state of disposition of bumps.

In these figures, reference numeral 5 denotes a semiconductor chip such as silicon or the like, on a main surface of the semiconductor chip 5 electrode pads 5a being formed. On the electrode pads formed surface of the semiconductor chip 5, ball-like solder bumps 6 are formed in an arrangement of two rows. Reference numeral 7 denotes a glass-epoxy wiring substrate, on both surfaces thereof wiring layers and bonding pads 7a connected thereto are disposed. On one surface of the wiring substrate 7, the semiconductor chip 5 is mounted with a face down to form electrical connection through the solder bumps 6. That is, the bumps 6 attached on the electrode pads 5a of the semiconductor chip 5 are pressed down onto the bonding pads 7a of the wiring substrate 7 to connect by solder reflow procedure. As to a size of a gap between the semiconductor chip 5 and the wiring substrate 7, an average value H (average gap) thereof satisfies the following equation.

$$P/4-D/2 \leq H \leq P/4+D/2.$$

(In the equation, P denotes an average (average pitch) of disposition pitches of the solder bumps 6, and D denotes deviation (=maximum gap value $H_{max}$–minimum gap value $H_{min}$) of the sizes of the gap).

The deviation D is obtained as follows. By use of section observation method, at five points of four corners and a center of the semiconductor chip 5, the heights (corresponds to the size of the gap) of solder bumps 6 are measured. From these measured values, the deviation D is obtained. For instance, $H_{max}$ being 58 $\mu$m and $H_{min}$ being 45 $\mu$m, D is 13 $\mu$m. For instance, when an average pitch P of the disposition pitches of the solder bumps is 200 $\mu$m, from the above equation, 43.5 $\mu$m $\leq$ H $\leq$ 56.5 $\mu$m is obtained. That is, an amount of solder in the solder bumps 6, diameters of solder bumps, diameters of bonding pads 7a of the wiring substrate 7 and the heights of the solder bumps 6 are set so that at all positions of bump disposition, the sizes of the gap between the semiconductor chip 5 and the wiring substrate 7 are in the range of from 43.5 $\mu$m to 56.5 $\mu$m.

On the other surface of the wiring substrate 7, external bonding pads 7b, which are external connecting terminals, are formed. The external bonding pads 7b and the solder bumps 6 are electrically connected through internal wiring (not shown in the figure) such as via holes or the like disposed on the wiring substrate 7. Furthermore, in the gap portion (having of the average gap H) between the wiring substrate 7 and the semiconductor chip 5 where the solder bumps 6 are disposed, a resin encapsulation layer (underfill) 8 is formed of epoxy based resin. The resin encapsulation layer (underfill) 8 is formed by discharging liquid resin material of viscosity of 0.01 to 2 Pa.S to fill in the gap portion between the wiring substrate 7 and the semiconductor chip 5. With the resin encapsulation layer 8, the connection between the semiconductor chip 5 and the wiring substrate 7 is mechanically protected, and the thermal stress due to the difference of thermal expansion coefficients both thereof is alleviated.

In the semiconductor device thus constituted of the first embodiment, the average gap H between the semiconductor chip 5 and the wiring substrate 7 is the optimum value satisfying P/4–D/2$\leq$H$\leq$P/4+D/2(in the equation, P is an average pitch of the bumps, and D is deviation of the size of the gap). As the result of this, the liquid resin material can be filled into the gap portion of the wiring substrate 7 and the semiconductor chip 5 within the shortest time. Accordingly, the semiconductor device of which flip-chip bonded portions, which are provided with underfill, are highly reliable can be fabricated with high productivity.

Figure 8:
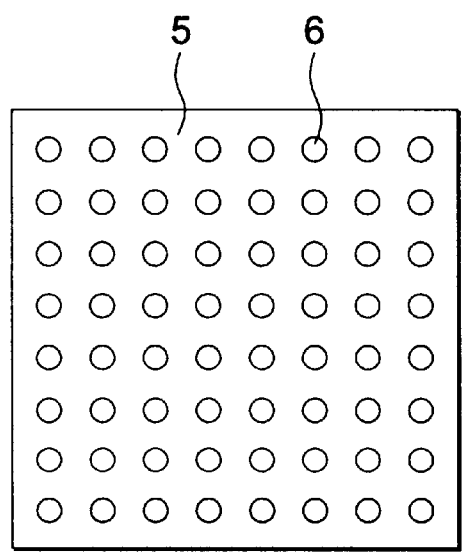
FIG. 8 is a plan view of a semiconductor chip showing a state of disposition of bumps in a second embodiment.
Figure 9:
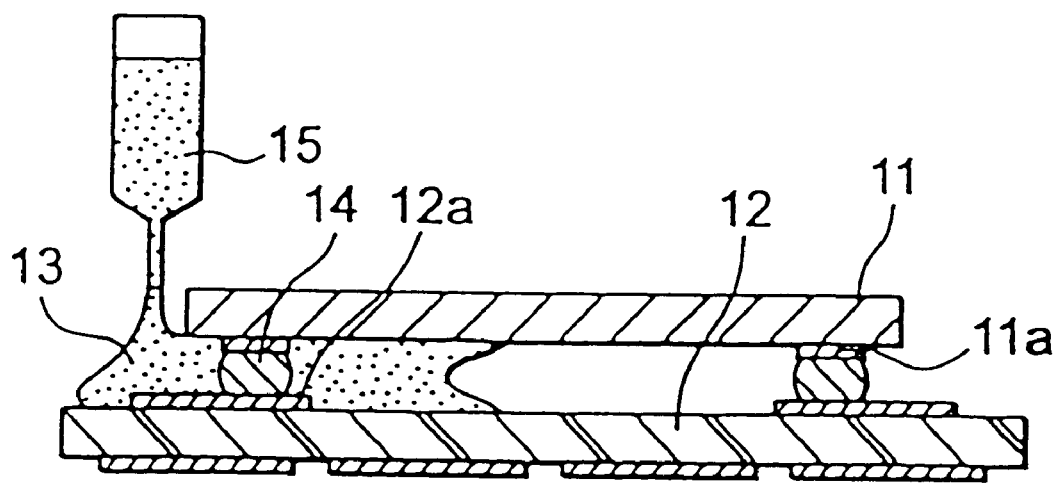
FIG. 9 is a diagram schematically showing a method for filling liquid resin material to form underfill.

In the above embodiment, the semiconductor device has a structure in which on the electrode pad formed surface of the semiconductor chip 5 the solder bumps 6 are arranged in two rows. However, without restricting to two rows of the bumps, a plurality of rows of bumps can be disposed. In the semiconductor device in which many bumps are disposed in many rows to form a disposition area, a large effect of shortening the filling time of the resin can be obtained. As shown in FIG. 8 in particular, in the semiconductor device in which the bumps 6 are disposed on an entire surface (in full area) of the electrode pad formed surface of the semiconductor chip 5, an immense effect can be obtained.

For the wiring substrate 7, without restricting to the resin based ones such as the glass-epoxy wiring substrates, ceramic based wiring substrates such as alumina based ones or aluminum nitride based ones can be used. Furthermore, on the bonding pads of the wiring substrate, a layer of low-melting metal such as solders may be formed. Still further, the bumps may be formed, instead of on the semiconductor chip side, on the wiring substrate side.

As obvious from the above explanation, according to the present invention, the liquid resin material can be filled into the gap portion between the semiconductor chip and the wiring substrate in a short time. As the result of this, the thermal stress can be alleviated due to the resin encapsulation layer (underfill), enabling to fabricate the a semiconductor device of high reliability at flip-chip bonded portions with high productivity and at low cost.

In addition, in the semiconductor device of the present invention, the resin can be filled within a short time. Accordingly, preceding the beginning of curing reaction of the resin, the temperature can be raised to lower the viscosity of the resin to be filled, resulting in a further improvement of productivity.

While the invention has been particularly shown and described with reference to preferred embodiments thereof, it will be understood by those skilled in the art that various other changes in the form and details may be made therein without departing from the spirit and scope of the invention.

What is claimed is:

1. A semiconductor device, comprising:

a wiring substrate in which at least on one main surface of an insulating substrate a wiring layer and a connecting terminal are formed;

a semiconductor element mounted with a face down on the main surface of the wiring substrate;

bumps disposed on an electrode terminal formed surface of the semiconductor element so as to arrange in a plurality of rows and connecting the semiconductor element and the wiring substrate; and a resin encapsulation layer filled in a gap portion between the semiconductor element and the wiring substrate;

wherein an average of a size of a gap (average gap) between the semiconductor element and the wiring substrate is H, an average of disposition pitch (average pitch) of the bumps is P, and deviation of the size of the gap is D, the average gap H satisfies the following equation (1).

$$P/4 - D/2 \leq H \leq P/4 + D/2 \qquad (1).$$

2. The semiconductor device as set forth in claim 1:

wherein the bumps are disposed so as to form a disposition area.

3. The semiconductor device as set forth in claim 1:

wherein the bumps are solder bumps.

4. The semiconductor device as set forth in claim 1:

wherein the disposition pitch of the bumps is a distance between adjacent rows of the bumps disposed along a filling direction of resin material constituting the resin encapsulation layer.

5. The semiconductor device as set forth in claim 1:

wherein an average pitch P of the bumps is in the range of 60 to 250 μm.

\* \* \* \* \*